United States Patent
Kang et al.

(10) Patent No.: US 11,747,192 B2
(45) Date of Patent: Sep. 5, 2023

(54) ACOUSTIC SENSOR ASSEMBLY AND METHOD OF SENSING SOUND USING THE SAME

(71) Applicant: SAMSUNG ELECTRONICS CO., LTD., Suwon-si (KR)

(72) Inventors: Hyunwook Kang, Daejeon (KR);
Cheheung Kim, Yongin-si (KR);
Daehyuk Son, Suwon-si (KR);
Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 17/348,184

(22) Filed: Jun. 15, 2021

(65) Prior Publication Data

US 2022/0214211 A1 Jul. 7, 2022

(30) Foreign Application Priority Data

Jan. 5, 2021 (KR) .................... 10-2021-0001062

(51) Int. Cl.
*G01H 11/00* (2006.01)
*H03H 9/02* (2006.01)
(Continued)

(52) U.S. Cl.
CPC .............. *G01H 11/00* (2013.01); *G01H 1/06* (2013.01); *G01H 11/02* (2013.01); *G01S 3/802* (2013.01);
(Continued)

(58) Field of Classification Search
CPC .......... G01H 11/00; G01H 11/06; H03H 9/02; H03H 17/0233; H03H 17/02; G01S 3/802;
(Continued)

(56) References Cited

U.S. PATENT DOCUMENTS

| 8,942,387 B2 | 1/2015 | Elko et al. |
| 9,294,833 B2 * | 3/2016 | Oouchi .................. H04R 1/406 |

(Continued)

FOREIGN PATENT DOCUMENTS

| EP | 2514218 B1 | 10/2014 |
| GB | 2234137 A * | 1/1991 ........... H04R 1/2838 |

(Continued)

OTHER PUBLICATIONS

"Ambisonics", https://en.wikipedia.org/wiki/Ambisonics, Sep. 2021, pp. 1-15.

(Continued)

*Primary Examiner* — Peter J Macchiarolo
*Assistant Examiner* — Monica S Young
(74) *Attorney, Agent, or Firm* — Sughrue Mion, PLLC

(57) ABSTRACT

An acoustic sensor assembly includes a non-directional acoustic sensor having a first directional pattern, a plurality of directional acoustic sensors surrounding the non-directional acoustic sensor and including a plurality of resonators having different resonance frequencies from each other, each of the plurality of directional acoustic sensors having a second directional pattern, and a processor configured to obtain output signals from the non-directional acoustic sensor and the plurality of directional acoustic sensors. The processor is further configured to calculate an acoustic signal having directivity by selecting any one or any combination of the obtained output signals or selectively combining the obtained output signals, and obtain sound around the acoustic sensor assembly, using the calculated acoustic signal.

20 Claims, 21 Drawing Sheets

(51) Int. Cl.
  *H03H 17/02* (2006.01)
  *H04R 1/40* (2006.01)
  *G01H 1/06* (2006.01)
  *G01H 11/02* (2006.01)
  *G01S 3/802* (2006.01)
  *H04R 1/20* (2006.01)

(52) U.S. Cl.
  CPC .............. *H03H 9/02* (2013.01); *H03H 17/02* (2013.01); *H03H 17/0233* (2013.01); *H04R 1/20* (2013.01); *H04R 1/406* (2013.01); *H04R 2410/01* (2013.01); *H04R 2430/20* (2013.01)

(58) Field of Classification Search
  CPC ...... H04R 1/20; H04R 1/406; H04R 2410/01; H04R 2430/20
  USPC .............................................. 73/645; 381/92
  See application file for complete search history.

(56) References Cited

U.S. PATENT DOCUMENTS

| | | | | |
|---|---|---|---|---|
| 9,549,245 | B2* | 1/2017 | Frater | H04R 1/02 |
| 10,141,007 | B1* | 11/2018 | Kim | G10L 25/18 |
| 10,225,662 | B2* | 3/2019 | Kim | H04R 29/00 |
| 11,088,315 | B2 | 8/2021 | Grosh et al. | |
| 2009/0103749 | A1 | 4/2009 | Goodwin | |
| 2009/0175466 | A1* | 7/2009 | Elko | H04R 25/407 |
| | | | | 381/94.1 |
| 2009/0238377 | A1 | 9/2009 | Ramakrishnan et al. | |
| 2012/0207322 | A1* | 8/2012 | Burnett | H04R 1/02 |
| | | | | 381/92 |
| 2014/0278394 | A1 | 9/2014 | Bastyr et al. | |
| 2017/0026741 | A1* | 1/2017 | Yoshino | H04R 1/406 |
| 2018/0097506 | A1* | 4/2018 | Kang | H04R 17/10 |
| 2019/0072635 | A1* | 3/2019 | Kang | G01S 3/805 |
| 2019/0122690 | A1 | 4/2019 | Kim et al. | |
| 2019/0174244 | A1* | 6/2019 | Kim | H04R 5/04 |
| 2020/0077179 | A1 | 3/2020 | Wang | |
| 2020/0400489 | A1 | 12/2020 | Kang et al. | |
| 2022/0182767 | A1* | 6/2022 | Sun | H04R 1/406 |

FOREIGN PATENT DOCUMENTS

| | | | | |
|---|---|---|---|---|
| KR | 101606780 B1 | 3/2016 | | |
| WO | WO-0228140 A2 * | 4/2002 | ............ | H04R 1/406 |

OTHER PUBLICATIONS

Wang, Z.-T., et al., "Passive Acoustic Monitoring the Diel, Lunar, Seasonal and Tidal Patterns in the Biosonar Activity of the Indo-Pacific Humpback Dolphins (*Sousa chinensis*) in the Pearl River Estuary, China", PLOS ONE, Nov. 18, 2015, pp. 1-24.

Communication dated Dec. 20, 2021 issued by the European Patent Office in application No. 21184002.0.

* cited by examiner

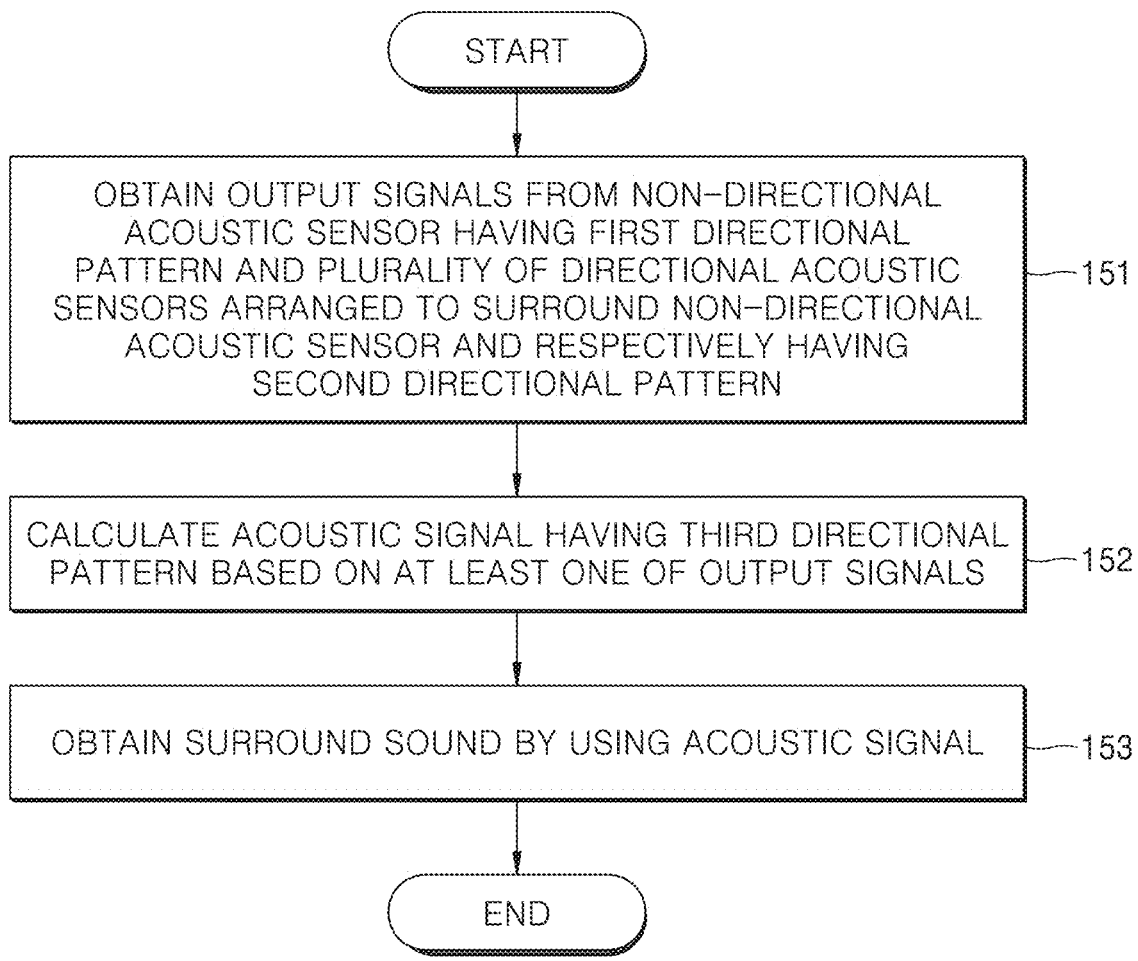

ACOUSTIC SENSOR ASSEMBLY AND METHOD OF SENSING SOUND USING THE SAME

CROSS-REFERENCE TO RELATED APPLICATION

This application is based on and claims priority under 35 U.S.C. § 119 to Korean Patent Application No. 10-2021-0001062, filed on Jan. 5, 2021, in the Korean Intellectual Property Office, the disclosure of which is incorporated by reference herein in its entirety.

BACKGROUND

1. Field

The disclosure relates to acoustic sensor assemblies and methods of sensing sound by using the same.

2. Description of Related Art dAcoustic sensors are mounted in household appliances, image display devices, virtual reality devices, augmented reality devices, artificial intelligence speakers, and the like, to detect a direction from which sounds are coming from and recognize voices. Such acoustic sensors are being used in increasingly more areas. Recently, a directional acoustic sensor that detects sound by converting a mechanical movement due to a pressure difference into an electrical signal has been developed.

SUMMARY

Provided are acoustic sensor assemblies and methods of sensing sound using the same.

Additional aspects will be set forth in part in the description that follows and, in part, will be apparent from the description, or may be learned by practice of the presented example embodiments of the disclosure.

According to an aspect of embodiments, an acoustic sensor assembly includes a non-directional acoustic sensor having a first directional pattern, a plurality of directional acoustic sensors surrounding the non-directional acoustic sensor and including a plurality of resonators having different resonance frequencies from each other, each of the plurality of directional acoustic sensors having a second directional pattern, and a processor configured to obtain output signals from the non-directional acoustic sensor and the plurality of directional acoustic sensors. The processor is further configured to calculate an acoustic signal having directivity by selecting any one or any combination of the obtained output signals or selectively combining the obtained output signals, and obtain sound around the acoustic sensor assembly, using the calculated acoustic signal.

Each of the plurality of directional acoustic sensors may be disposed such that the second directional pattern is in a radial direction with respect to the non-directional acoustic sensor.

Each of the plurality of directional acoustic sensors may be configured to sense, in a direction of the second directional pattern, a sound that is in-phase with a phase of a sound that is sensed by the non-directional acoustic sensor, and sense, in a direction opposite to the direction of the second directional pattern, a sound that is anti-phase with the phase of the sound sensed by the non-directional acoustic sensor.

The processor may be further configured to calculate the acoustic signal having a third directional pattern different from the first directional pattern and the second directional pattern.

The first directional pattern may be omnidirectional, the second directional pattern may be bi-directional, and the third directional pattern may be uni-directional.

The processor may be further configured to calculate a plurality of acoustic signals having third directional patterns oriented in different directions from each other, and obtain the sound around the acoustic sensor assembly, using the calculated plurality of acoustic signals.

The processor may be further configured to calculate the acoustic signal by calculating a sum of or a difference between ratios of a first output signal of the non-directional acoustic sensor and a second output signal of each of the plurality of directional acoustic sensors, among the obtained output signals.

The processor may be further configured to calculate the acoustic signal having a third directional pattern in a front direction of one of the plurality of directional acoustic sensors corresponding to the second output signal, by calculating the sum of the ratios of the first output signal and the second output signal.

The processor may be further configured to calculate the acoustic signal having a third directional pattern in a rear side direction of one of the plurality of directional acoustic sensor corresponding to the second output signal, by calculating the difference between the ratios of the first output signal and the second output signal.

Each of the plurality of directional acoustic sensors may further include a support, and the plurality of resonators may extend from the support in a length direction.

Each of the plurality of resonators may include a driver moving based on input sound, and a sensor detecting movement of the driver.

An electronic device includes the acoustic sensor assembly.

According to an aspect of embodiments, a method of sensing sound includes obtaining output signals from a non-directional acoustic sensor having a first directional pattern and a plurality of directional acoustic sensors, the plurality of directional acoustic sensors surrounding the non-directional acoustic sensor, and including a plurality of resonators having different resonance frequencies from each other, and each of the plurality of directional acoustic sensors having a second directional pattern. The method further includes calculating an acoustic signal having directivity by selecting any one or any combination of the obtained output signals or selectively combining the obtained output signals, and obtaining sound around an acoustic sensor assembly, using the acoustic calculated signal.

Each of the plurality of directional acoustic sensors may be disposed such that the second directional pattern is in a radial direction with respect to the non-directional acoustic sensor.

The obtaining of the output signals may include sensing, in a direction of the second directional pattern, a sound that is in-phase with a phase of a sound that is sensed by the non-directional acoustic sensor, and sensing, in a direction opposite to the direction of the second directional pattern, a sound that is anti-phase with the phase of the sound sensed by the non-directional acoustic sensor.

The calculating of the acoustic signal may include calculating a plurality of acoustic signals having third directional patterns oriented in different directions from each other, and the obtaining of the sound includes obtaining the sound, using the calculated plurality of acoustic signals.

The calculating of the acoustic signal may include calculating the acoustic signal by calculating a sum of or a difference between ratios of a first output signal of the non-directional acoustic sensor and a second output signal of each of the plurality of directional acoustic sensors, among the obtained output signals.

The calculating of the acoustic signal may further include calculating the acoustic signal having a third directional pattern in a front direction of one of the plurality of directional acoustic sensors corresponding to the second output signal, by calculating the sum of the ratios of the first output signal and the second output signal.

The calculating of the acoustic signal may further include calculating the acoustic signal having a third directional pattern in a rear side direction of one of the plurality of directional acoustic sensors corresponding to the second output signal, by calculating the difference between the ratios of the first output signal and the second output signal.

A non-transitory computer-readable storage medium stores instructions that, when executed by at least one processor, cause the at least one processor to perform the method.

According to an aspect of embodiments, an acoustic sensor assembly includes a non-directional acoustic sensor configured to sense sound in all directions, a plurality of directional acoustic sensors surrounding the non-directional acoustic sensor, each of the plurality of directional acoustic sensors being configured to sense sound in a front direction and a rear side direction, and a processor configured to obtain output signals from the non-directional acoustic sensor and the plurality of directional acoustic sensors. The processor is further configured to calculate an acoustic signal in the front direction or the rear side direction of each of the plurality of directional acoustic sensors by calculating a sum of or difference between ratios of a first one of the output signals from the non-directional acoustic sensor and a second one of the output signals from a respective one of the plurality of directional acoustic sensors, and obtain sound around the acoustic sensor assembly, using the calculated acoustic signal of each of the plurality of directional acoustic sensors.

Each of the plurality of directional acoustic sensors may be disposed such that the front direction or the rear side direction is in a radial direction with respect to the non-directional acoustic sensor.

BRIEF DESCRIPTION OF THE DRAWINGS

The above and other aspects, features, and advantages of example embodiments of the disclosure will be more apparent from the following description taken in conjunction with the accompanying drawings, in which:

FIG. 15 is a flowchart of a method of sensing sound, according to embodiments.

DETAILED DESCRIPTION

Figure 1:
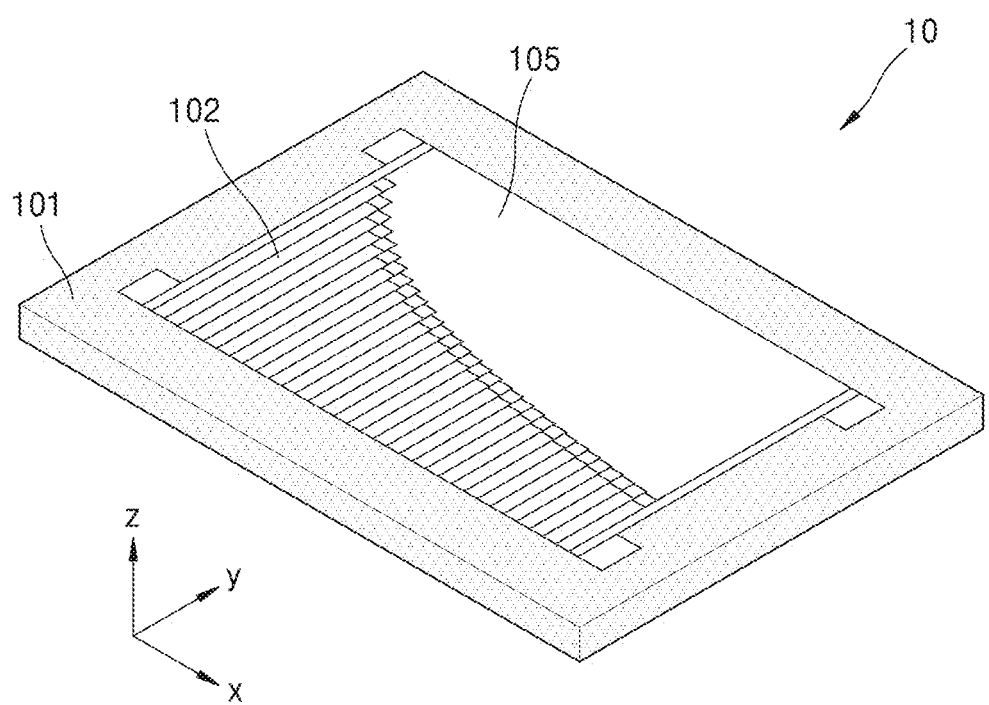
FIG. 1 is a perspective view of a directional acoustic sensor according to embodiments.

Reference will now be made in detail to embodiments, examples of which are illustrated in the accompanying drawings, wherein like reference numerals refer to like elements throughout. In this regard, the present embodiments may have different forms and may not be construed as being limited to the descriptions set forth herein. Accordingly, the embodiments are described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the embodiments below are those general terms currently widely used in the art in consideration of functions in regard to the present embodiments, but the terms may vary according to the intention of those of ordinary skill in the art, precedents, or new technology in the art. Also, specified terms may be selected by the applicant, and in this case, the detailed meaning thereof will be described in the detailed description of the relevant embodiment. Thus, the terms used in the specification may be understood not as simple names but based on the meaning of the terms and the overall description of the embodiments.

In the description of the embodiments, it will also be understood that when an element is referred to as being "above" or "on" another element, it can be directly on, under, on the left of, or on the right of the other element, or intervening elements may also be present. The singular forms include the plural forms unless the context clearly indicates otherwise.

In the description of the embodiments, it will also be understood that when an element is referred to as being "connected to" another element, it can be directly connected to the other element, or it can be electrically connected to the other element and intervening elements may be present.

The terms such as "comprise" or "include" may not be construed as necessarily including various elements or processes described in the specification, and it may be construed that some of the elements or the processes may not be included, or additional elements or processes may be further included.

Herein, terms including ordinal numbers such as 'first', 'second', etc. are used to describe various elements, but the elements may not be defined by these terms. The terms are used only for distinguishing one element from another element.

The present embodiments relate to an acoustic sensor assembly, and description of details that are well known to those of ordinary skill in the art may be omitted.

Description of the following embodiments may not be construed as limiting or defining the scope of the disclosure, and details that are easily derivable by one of ordinary skill in the art to which the disclosure pertains are construed as being in the scope of the embodiments. Hereinafter, the embodiments that are just for illustration will be described in detail with reference to the attached drawings.

Figure 2:
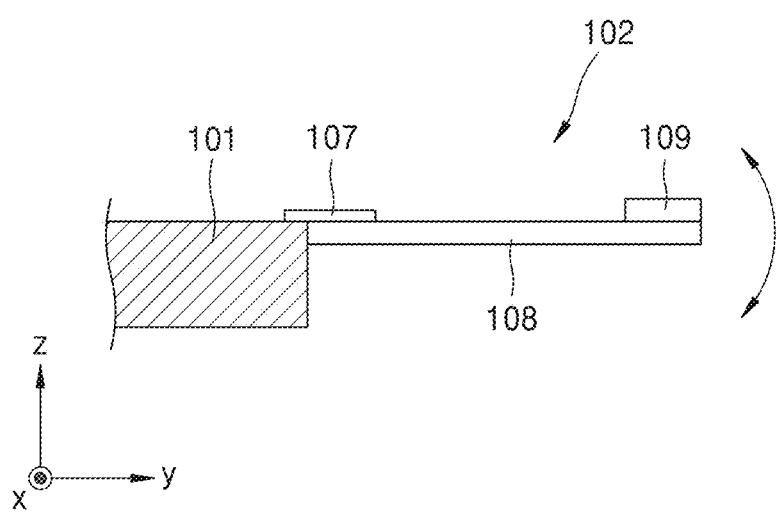
FIG. 2 is a cross-sectional view of a resonator illustrated in FIG. 1.

FIG. 1 is a perspective view of a directional acoustic sensor 10 according to embodiments. FIG. 2 is a cross-sectional view of a resonator 102 illustrated in FIG. 1.

Referring to FIGS. 1 and 2, the directional acoustic sensor 10 may include a support 101 and a plurality of resonators 102. A cavity 105 may be formed in the support 101 to pass through the support 101. As the support 101, for example, a silicon substrate may be used, but is not limited thereto.

The plurality of resonators 102 may be arranged in the cavity 105 of the support 101 in a form. The resonators 102 may be arranged two-dimensionally without overlapping each other. As illustrated in FIG. 2, an end of each of the resonators 102 may be fixed to the support 101, and the other end thereof may extend toward the cavity 105. Each of the resonators 102 may include a driver 108 moving by reacting to an input sound and a sensor 107 sensing a movement of the driver 108. Also, the resonators 102 may further include a mass body 109 for providing a mass to the driver 108.

The resonators 102 may be provided to sense, for example, acoustic frequencies of different bands. That is, the resonators 102 may be provided to have different center frequencies or resonance frequencies. To this end, the resonators 102 may be provided to have different dimensions from each other. For example, the resonators 102 may be provided to have different lengths, widths or thicknesses from each other.

Dimensions such as widths or thicknesses of the resonators 102 may be set by considering a desired resonance frequency with respect to the resonators 102. For example, the resonators 102 may have dimensions such as a width from about several μm to several hundreds of μm, a thickness of several μm or less, and a length of about several mm or less. The resonators 102 having fine sizes may be manufactured in a Micro Electro Mechanical System (MEMS) process.

Figure 3:
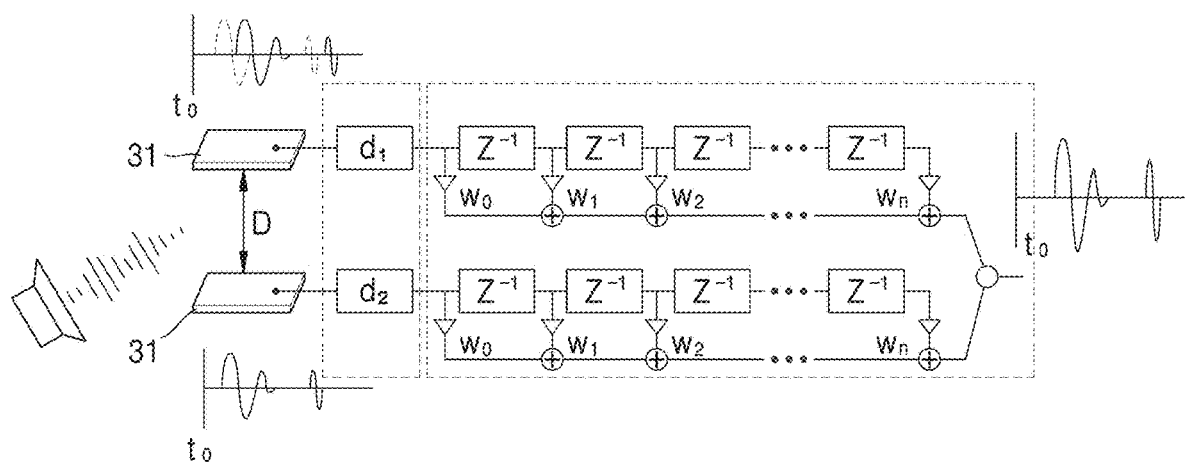
FIG. 3 is a diagram for describing a method of adjusting directivity by using a plurality of acoustic sensors, according to a comparative example.

FIG. 3 is a diagram for describing a method of adjusting directivity by using a plurality of acoustic sensors 31, according to a comparative example.

Referring to FIG. 3, in a method of adjusting directivity by using the plurality of acoustic sensors 31, the plurality of acoustic sensors 31 may be used to hear a sound in a direction louder. The plurality of acoustic sensors 31 may be arranged at a distance D, and a time or phase delay that sound reaches each acoustic sensor 31 is caused due to the distance D, and the overall directivity may be adjusted by differentiating a degree of compensating for the time or phase delay. The method of adjusting directivity as described above may be referred to as Time Difference of Arrival (TDOA).

However, the above method is based on the assumption that there is a difference in times that sound reaches each acoustic sensor. Thus, there may be a restriction on setting a distance between acoustic sensors as the distance may need to be set by considering a wavelength of an audible frequency band. The restriction on setting a distance between acoustic sensors may also limit providing a compact size of a device performing the above method. As a low frequency has a longer wavelength, to distinguish a sound of a low frequency, a distance between acoustic sensors may need to be relatively broad and a signal-to-noise ratio (SNR) of each acoustic sensor may need to be relatively high.

Moreover, as phases differ according to frequency bands of sound sensed by each acoustic sensor in the above-described method, the phases may have to be compensated for with respect to each frequency band. To compensate for the phase of each frequency, a complex signal processing process of applying an appropriate weight for each frequency may be necessary in the above-described method.

According to the disclosure, there may be provided an acoustic sensor assembly in which there is no restriction on distances between acoustic sensors and whereby ambient sound may be obtained by distinguishing a direction with only a relatively simple operation and without complex signal processing. Hereinafter, an efficient structure and operation of the acoustic sensor assembly according to the disclosure will be described in detail with reference to the drawings.

Figure 4:
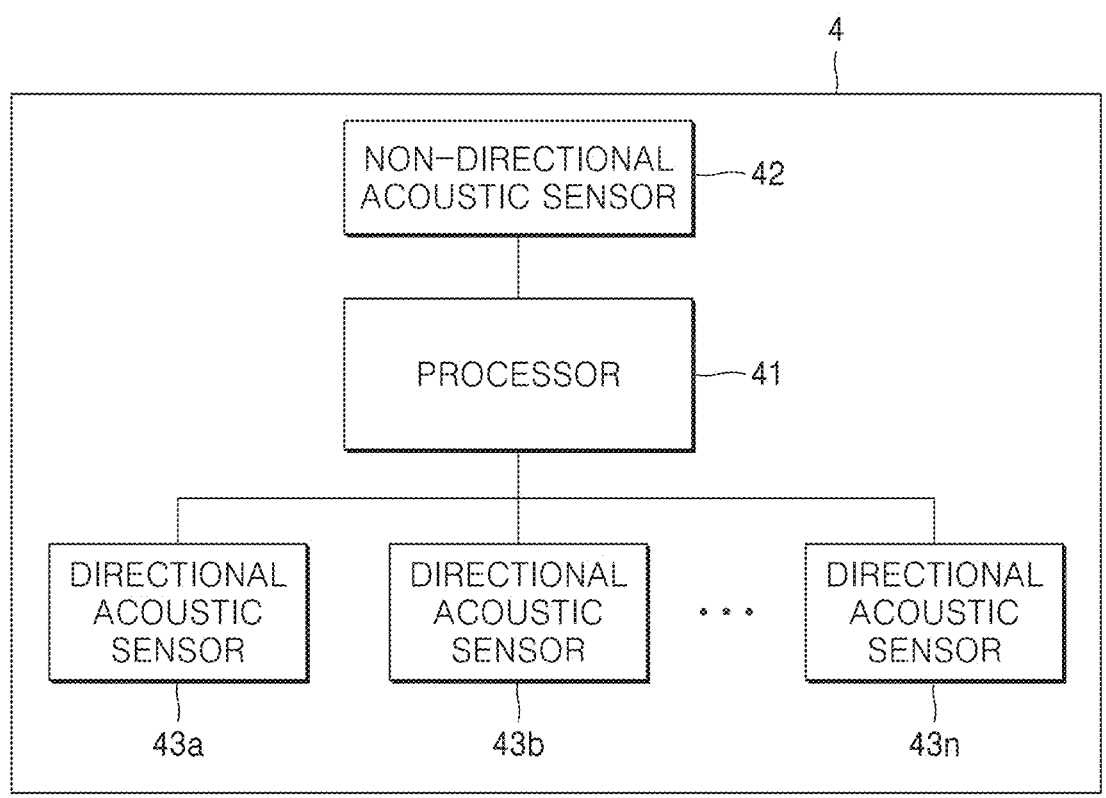
FIG. 4 is a block diagram of an acoustic sensor assembly according to embodiments.

FIG. 4 is a block diagram of an acoustic sensor assembly 4 according to embodiments.

Referring to FIG. 4, the acoustic sensor assembly 4 may include a processor 41, a non-directional acoustic sensor 42, and a plurality of directional acoustic sensors 43a, 43b, . . . , 43n. The acoustic sensor assembly 4 may obtain sound around the acoustic sensor assembly 4 by using the processor 41, the non-directional acoustic sensor 42, and the plurality of directional acoustic sensors 43a, 43b, . . . , 43n.

The non-directional acoustic sensor 42 may sense sound in all directions surrounding the non-directional acoustic sensor 42. The non-directional acoustic sensor 42 may have directivity for uniformly sensing sound in all directions. For example, the directivity for uniformly sensing sound in all directions may be omni-directional or non-directional.

The sound sensed using the non-directional acoustic sensor 42 may be output as a same output signal from the non-directional acoustic sensor 42, regardless of a direction in which the sound is input. Accordingly, a sound source reproduced based on the output signal of the non-directional acoustic sensor 42 may not include information on direction.

A directivity of an acoustic sensor may be expressed using a directional pattern, and the directional pattern may refer to a pattern indicating a direction in which an acoustic sensor may receive a sound source.

A directional pattern may be illustrated to identify sensitivity of an acoustic sensor according to a direction in which sound is transmitted based on a 360° space surrounding the acoustic sensor having the directional pattern. For example, a directional pattern of the non-directional acoustic sensor 42 may be illustrated in a circle to indicate that the non-directional acoustic sensor 42 has the same sensitivity to sounds transmitted 360° omni-directionally. An application of the directional pattern of the non-directional acoustic sensor 42 will be described later with reference to FIGS. 8A and 8B.

Each of the plurality of directional acoustic sensors 43a, 43b, . . . , 43n may have a same configuration as the directional acoustic sensor 10 illustrated in FIG. 1 described above. The plurality of directional acoustic sensors 43a, 43b, . . . , 43n may sense sound from a front (e.g., +z direction in FIG. 1) and a rear side (e.g., −z direction of FIG. 1). Each of the plurality of directional acoustic sensors 43a, 43b, . . . , 43n may have directivity of sensing sounds from the front and the rear side. For example, directivity for sensing sounds from a front direction and a rear side direction may be bi-directional.

The plurality of directional acoustic sensors 43a, 43b, . . . , 43n may be arranged to surround the non-directional acoustic sensor 42. An arrangement structure of the plurality of directional acoustic sensors 43a, 43b, . . . , 43n will be described later in detail with reference to FIGS. 11A through 13B.

The processor 41 controls the overall operation of the acoustic sensor assembly 4 and performs signal processing. The processor 41 may select any one or any combination of output signals of acoustic sensors having different directivities, thereby calculating an acoustic signal having a same directivity as those of the acoustic sensors 42, 43a, 43b, . . . , 43n. An acoustic signal having a directional pattern of an acoustic sensor corresponding to an output signal selected by the processor 41 may be calculated based on the output signal selected by the processor 41. For example, the selected output signal may be identical to the acoustic signal. The processor 41 may adjust directivity by selecting a directional pattern of the acoustic sensor assembly 4 as a directional pattern of an acoustic sensor corresponding to the selected output signal, and may reduce or loudly sense sound transmitted in a direction according to situations.

An acoustic signal refers to a signal including information about directivity, like output signals of the acoustic sensors 42, 43a, 43b, . . . , 43n, and some of the output signals may be selected and determined as acoustic signals or may be newly calculated based on calculation of some of the output signals. A directional pattern of an acoustic signal may be in a same shape as directional patterns of the acoustic sensors 42, 43a, 43b, . . . , 43n or in a different shape, and have a same or different directivity. That is, there is no limitation on a directional pattern or directivity of an acoustic signal.

The processor 41 may obtain output signals of the non-directional acoustic sensor 42 and/or the plurality of directional acoustic sensors 43a, 43b, . . . , 43n, and may calculate an acoustic signal having a different directivity from those of the acoustic sensors 42, 43a, 43b, . . . , 43n included in the acoustic sensor assembly 4 by selectively combining the obtained output signals. For example, the processor 41 may calculate an acoustic signal having a different directional pattern from directional patterns of the acoustic sensors 42, 43a, 43b, . . . , 43n. The processor 41 may calculate an acoustic signal having a directional pattern oriented toward a front of a directional acoustic sensor (e.g., 43a), depending on the situation.

The processor 41 may calculate an acoustic signal by calculating any one or any combination of a sum of and a difference between ratios of an output signal of the non-directional acoustic sensor 42 and output signals of the plurality of directional acoustic sensors 43a, 43b, . . . , 43n.

The processor 41 may obtain sound around the acoustic sensor assembly 4 by using an acoustic signal. The processor 41 may obtain ambient sound by distinguishing a direction of a sound transmitted to the acoustic sensor assembly 4 by using an acoustic signal. For example, when the processor 41 records a sound source transmitted from the right side of the acoustic sensor assembly 4 and provides the recorded sound source to a user, the user may hear the sound source as if it is coming from the right side of the user; when the processor 41 records a sound source circling the acoustic sensor assembly 4 and provides the recorded sound source to the user, the user may hear the sound source as if it is circling the user.

The processor 41 may include a single processor core (single-core) or a plurality of processor cores (multi-core). The processor 41 may process or execute programs and/or data stored in a memory. In some embodiments, the processor 41 may control a function of the acoustic sensor assembly 4 by executing programs stored in a memory. The processor 41 may be implemented as a central processing unit (CPU), a graphic processing unit (GPU), an application processor (AP), or the like.

Figure 5:
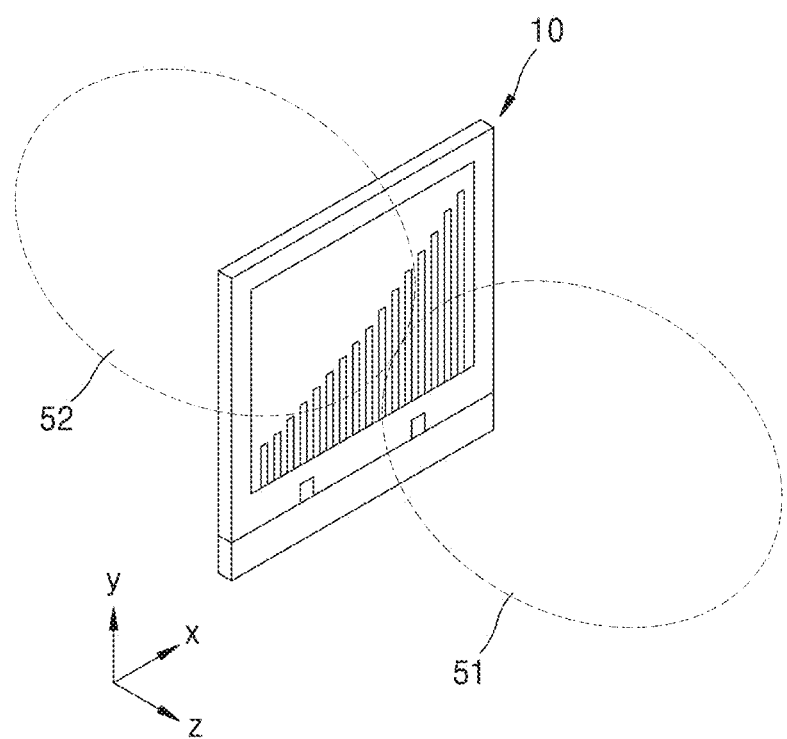
FIG. 5 is a diagram for describing a directional acoustic sensor according to embodiments and a directional pattern of the directional acoustic sensor, according to embodiments.

FIG. 5 is a diagram for describing the directional acoustic sensor 10 according to embodiments and a directional pattern 51 or 52 of the directional acoustic sensor 10.

Referring to FIG. 5, the directional acoustic sensor 10 may include the bi-directional patterns 51 and 52. For example, the bi-directional patterns 51 and 52 may be a figure-8 type directional pattern including a front portion 51 oriented toward a front of the directional acoustic sensor 10 (+z direction) and a rear side portion 52 oriented toward a rear side (−z direction) of the directional acoustic sensor 10.

Figure 6:
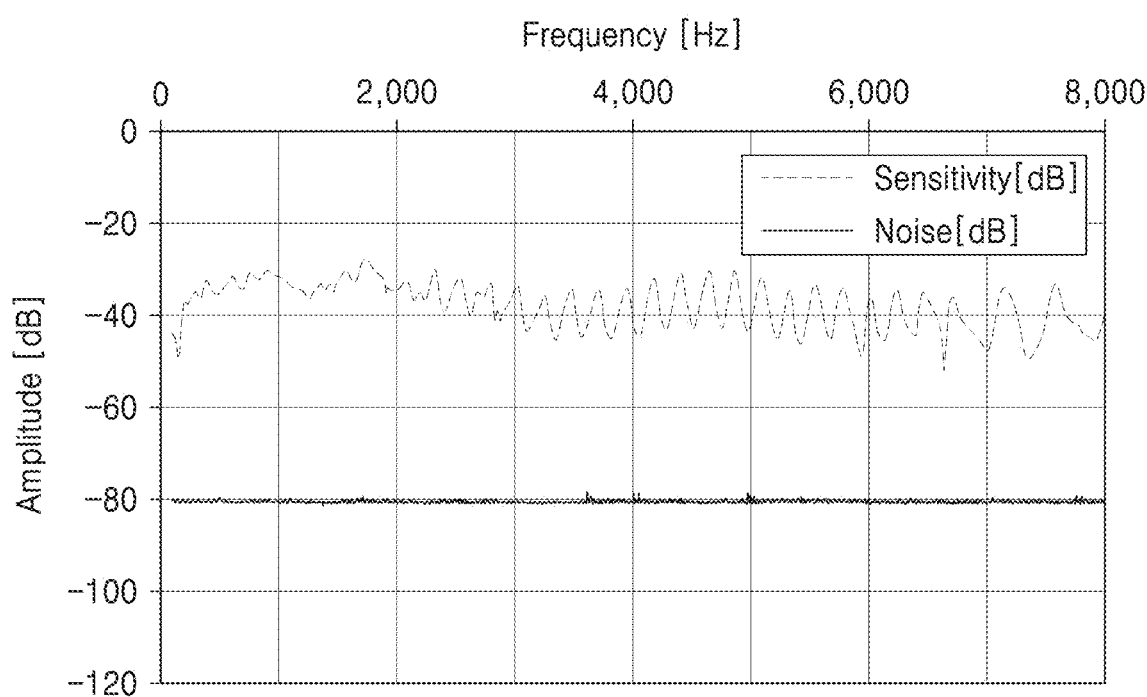
FIG. 6 is a graph showing results of measurement of frequency response characteristics of a directional acoustic sensor according to embodiments.

FIG. 6 is a graph showing results of measurement of frequency response characteristics of a directional acoustic sensor according to embodiments.

Referring to FIG. 6, the directional acoustic sensor 10 has uniform sensitivity to various frequencies. In a frequency range from 0 Hz to 8000 Hz, sensitivity marked by a dashed line is uniformly at −40 dB, and noise marked by a solid line is at −80 dB. The directional acoustic sensor 10 has uniform sensitivity with respect to various frequencies, and may thus uniformly sense sounds of the various frequencies.

Figure 7:
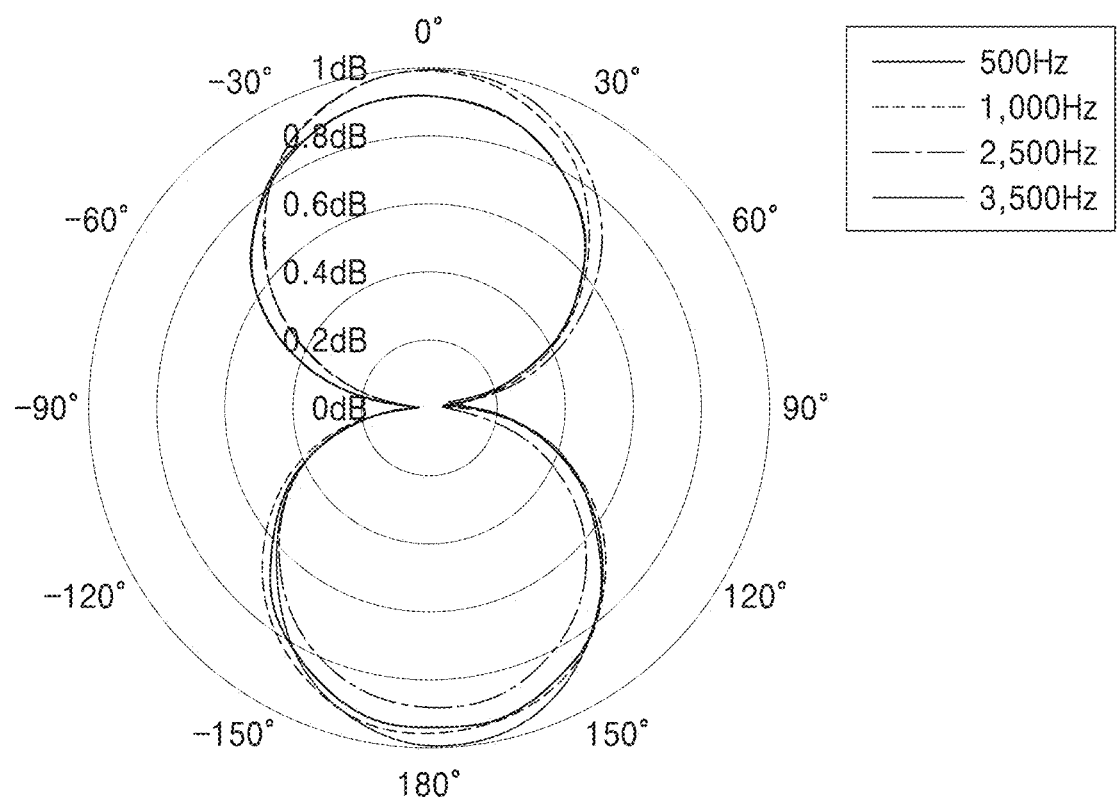
FIG. 7 is a diagram of results of measurement of a directional pattern of a directional acoustic sensor according to embodiments.

FIG. 7 is a diagram of results of measurement of a directional pattern of a directional acoustic sensor according to embodiments.

As illustrated in FIG. 7, the directional acoustic sensor 10 has a uniform, bi-directional pattern with respect to various frequencies. That is, the directional acoustic sensor 10 has directivity in a +z axis direction and a −z axis direction of FIG. 1, which are respectively a 0-degree direction and a 180-degree direction.

Figure 8A:
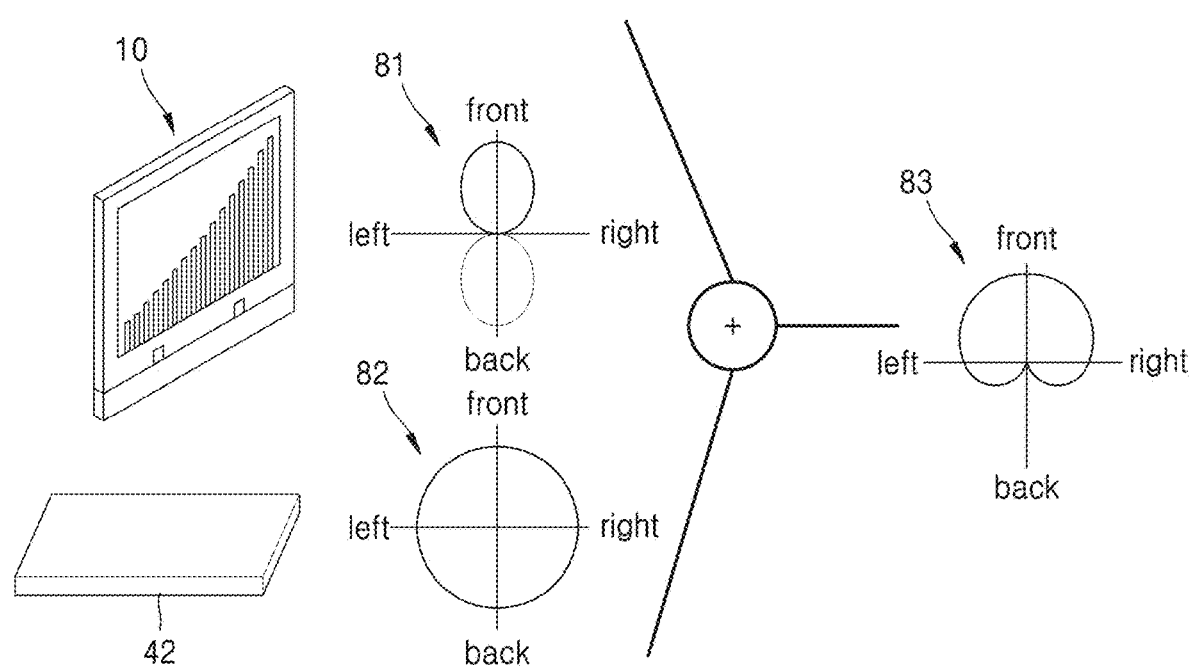
FIGS. 8A and 8B are diagrams for describing signal processing of an acoustic sensor assembly according to embodiments.
Figure 8B:
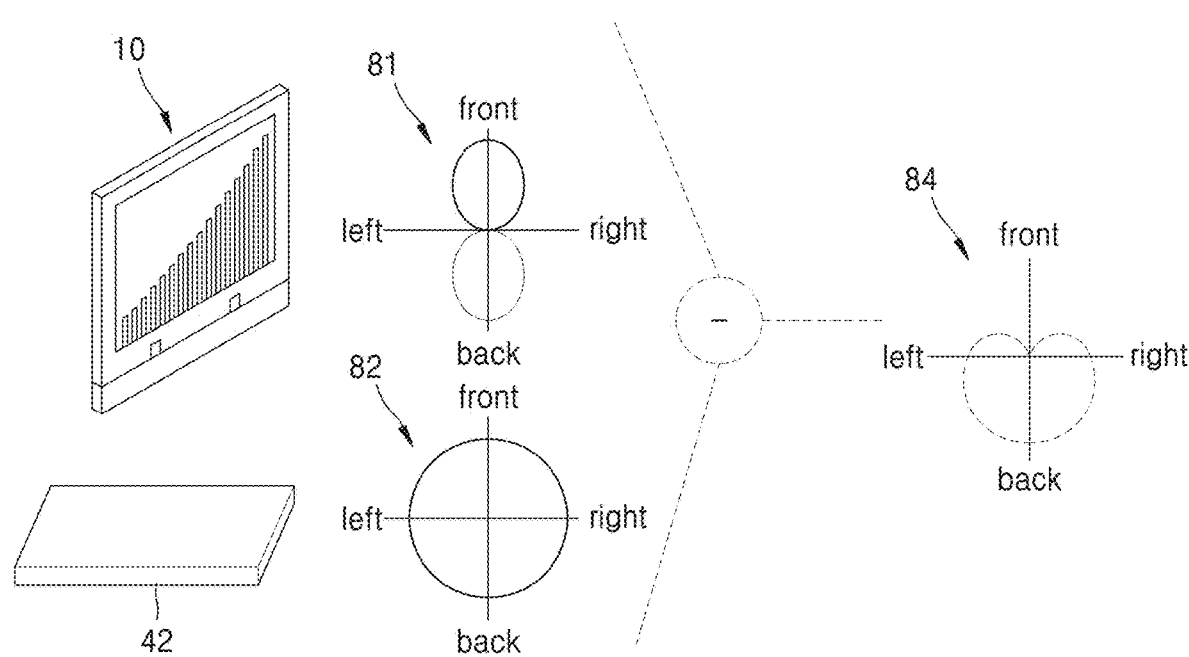

FIGS. 8A and 8B are diagrams for describing signal processing of an acoustic sensor assembly according to embodiments.

Referring to FIG. 8A, the processor 41 may calculate an acoustic signal by calculating any one or any combination of a sum of and a difference between ratios of an output signal of the non-directional acoustic sensor 42 and an output signal of the directional acoustic sensor 10. An acoustic signal may be a digital signal calculated based on output signals to be in a different shape or have a different directivity from those of direction patterns (a bi-directional pattern 81 and an omni-directional pattern 82) of the directional acoustic sensor 10 and the non-directional acoustic sensor 42.

For example, in a calculation to calculate an acoustic signal, when an output signal of the non-directional acoustic sensor 42 is G1, and an output signal of the directional acoustic sensor 10 is G2, and a ratio of the output signal G2 of the directional acoustic sensor 10 to the acoustic signal G1 of the non-directional acoustic sensor 42 is 1:k, a sum of ratios of the output signals G1 and G2 may be calculated using a formula of G1+kG2, and a difference between the ratios of the output signals G1 and G2 may be calculated using a formula of G1-kG2. A ratio of each of the output signals may be preset according to a shape or directivity of an appropriate directional pattern used by the acoustic sensor assembly 4 (FIG. 4).

The processor 41 may calculate an acoustic signal having a directional pattern oriented toward the front direction of the directional acoustic sensor 10 (e.g., +z direction of FIG. 5) by calculating a sum of ratios of the output signal of the non-directional acoustic sensor 42 and the output signal of the directional acoustic sensor 10.

The non-directional acoustic sensor 42 is oriented in all directions, and thus, there may be no difference in output signals regardless of a direction in which sound is transmitted. However, for convenience of description below, the front direction of the directional acoustic sensor 10 will be assumed to be identical to a front direction of the non-directional acoustic sensor 42.

For example, the processor 41 may calculate an acoustic signal having a uni-directional pattern 83 by calculating a sum of 1:1 ratios of an output signal of the non-directional acoustic sensor 42 and an output signal of the directional acoustic sensor 10. The uni-directional pattern 83 may have a directivity facing the front of the directional acoustic sensor 10. However, the uni-directional pattern 83 may be a directional pattern covering a broader range to the left and the right, compared to a front portion of the bi-directional pattern 81. For example, the uni-directional pattern 83 may be a cardioid directional pattern.

The directional acoustic sensor 10 may include the bi-directional pattern 81, and the non-directional acoustic sensor 42 may include the omni-directional pattern 82. The directional acoustic sensor 10 may sense a sound that is in-phase with a phase of a sound sensed by the non-directional acoustic sensor 42 from a front direction of the bi-directional pattern 81 (e.g., +z direction of FIG. 5), and a sound that is anti-phase with a phase of a sound sensed by the non-directional acoustic sensor 42 from a rear side direction of the bi-directional pattern 81 (e.g., −z direction of FIG. 5).

Figure 9A:
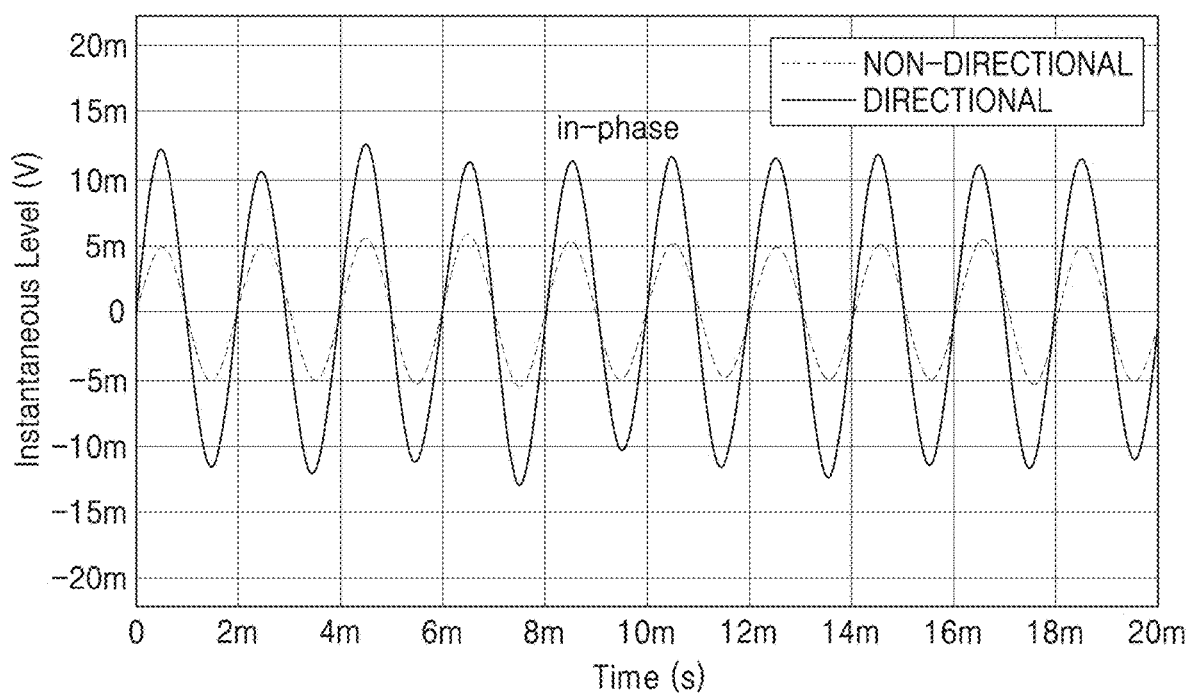
FIG. 9A is a graph showing a result of sensing sound transmitted from a front direction, by acoustic sensors, according to embodiments.
Figure 9B:
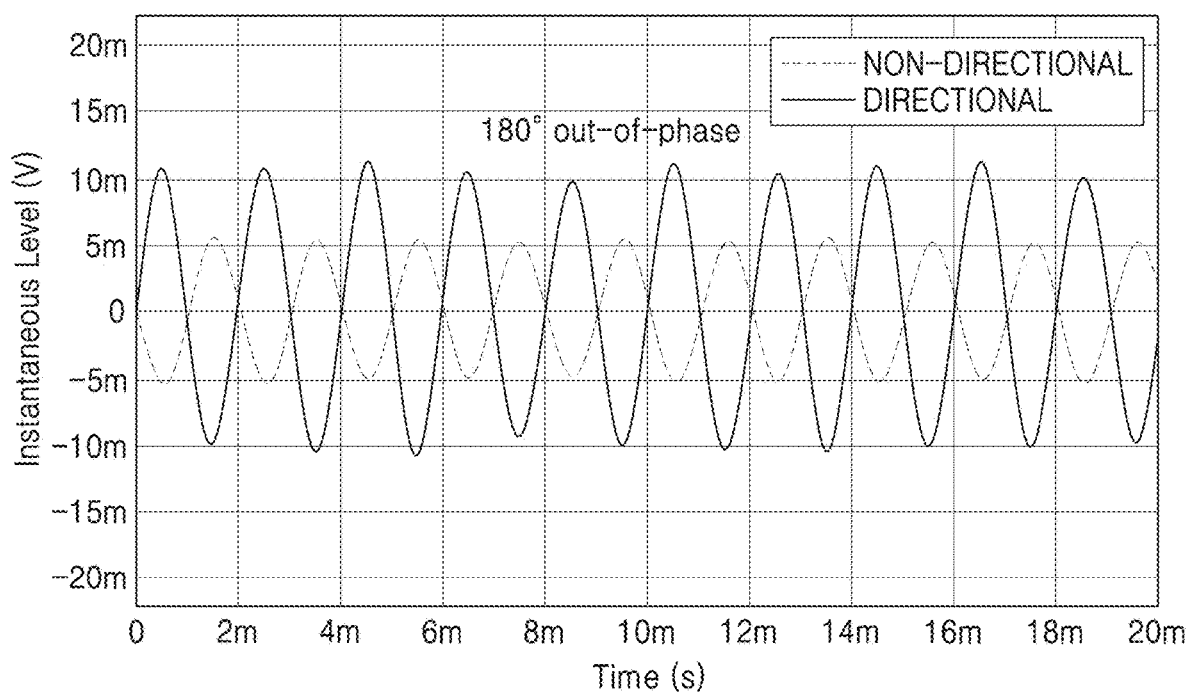
FIG. 9B is a graph showing a result of sensing sound transmitted from a rear side direction, by acoustic sensors, according to embodiments.

FIG. 9A is a graph showing a result of sensing sound transmitted from a front direction, by acoustic sensors, according to embodiments. FIG. 9B is a graph showing a result of sensing sound transmitted from a rear side direction, by acoustic sensors, according to embodiments.

Referring to FIGS. 9A and 9B, a sound transmitted from the front direction of the directional acoustic sensor 10 and a sound transmitted from the front direction of the non-directional acoustic sensor 42 are in-phase with each other, and the sound transmitted from the front direction of the directional acoustic sensor 10 and sound transmitted from the rear side direction of the non-directional acoustic sensor 42 have a phase difference of 180° from each other such that peaks and troughs alternately cross each other.

Referring back to FIG. 8A, sounds transmitted from the front direction are in-phase with each other, and sounds transmitted from the rear side direction are in anti-phase with each other, and thus, some of the output signals are added and some others are offset and an acoustic signal having the uni-directional pattern 83 oriented in the front direction may be calculated.

Referring to FIG. 8B, the processor 41 may calculate an acoustic signal having a directional pattern oriented toward the rear side direction of the directional acoustic sensor 10 (e.g., −z direction of FIG. 5) by calculating a difference between ratios of an output signal of the non-directional acoustic sensor 42 and an output signal of the directional acoustic sensor 10.

For example, the processor 41 may calculate an acoustic signal having a uni-directional pattern 84 by calculating a difference between 1:1 ratios of an output signal of the non-directional acoustic sensor 42 and an output signal of the directional acoustic sensor 10. The uni-directional pattern 84 may have a directivity facing a rear surface of the directional acoustic sensor 10, opposite to the uni-directional pattern 83 of FIG. 8B. The uni-directional pattern 84 may be a directional pattern covering a broader range to the left and the right, compared to a rear side portion of the bi-directional pattern 81. For example, the uni-directional pattern 83 may be a cardioid directional pattern.

While a method of calculating an acoustic signal having a uni-directional pattern by calculating a sum of or a difference between an output of the directional acoustic sensor 10 and an output of the non-directional acoustic sensor 42 is described above, this is an example, and the control of directivity of the acoustic sensor assembly 4 by using output signals of acoustic sensors is not limited to the above-described method.

The processor 41 may calculate an acoustic signal having a new bi-directional pattern differing from bi-directivity of directional acoustic sensors by selecting only a non-directional pattern, or selecting only a bi-directional pattern of a directional acoustic sensor oriented toward a direction, or calculating output signals of directional acoustic sensors, according to situations.

Figure 10A:
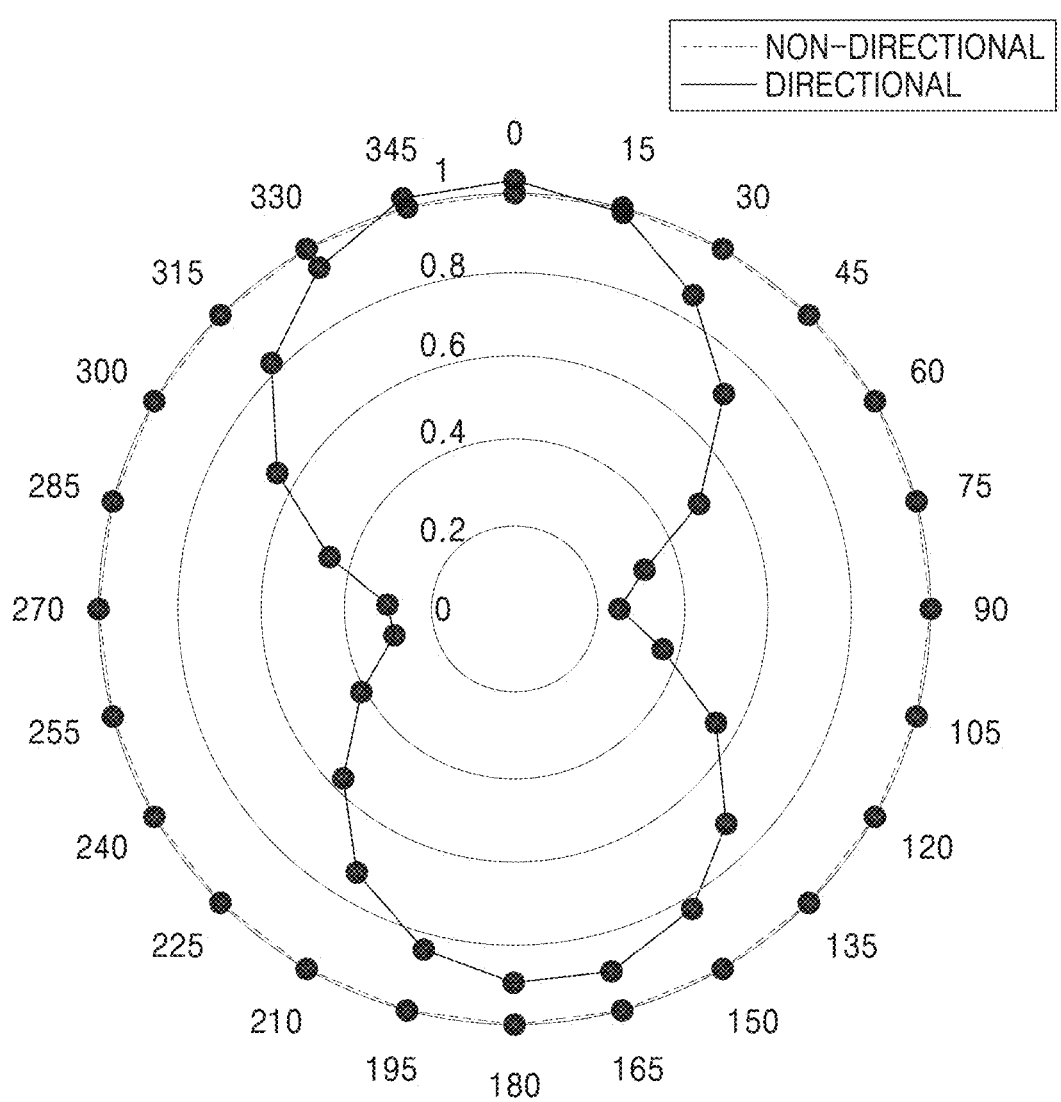
FIG. 10A is a graph showing measurement of directional patterns of acoustic sensors according to embodiments.
Figure 10B:
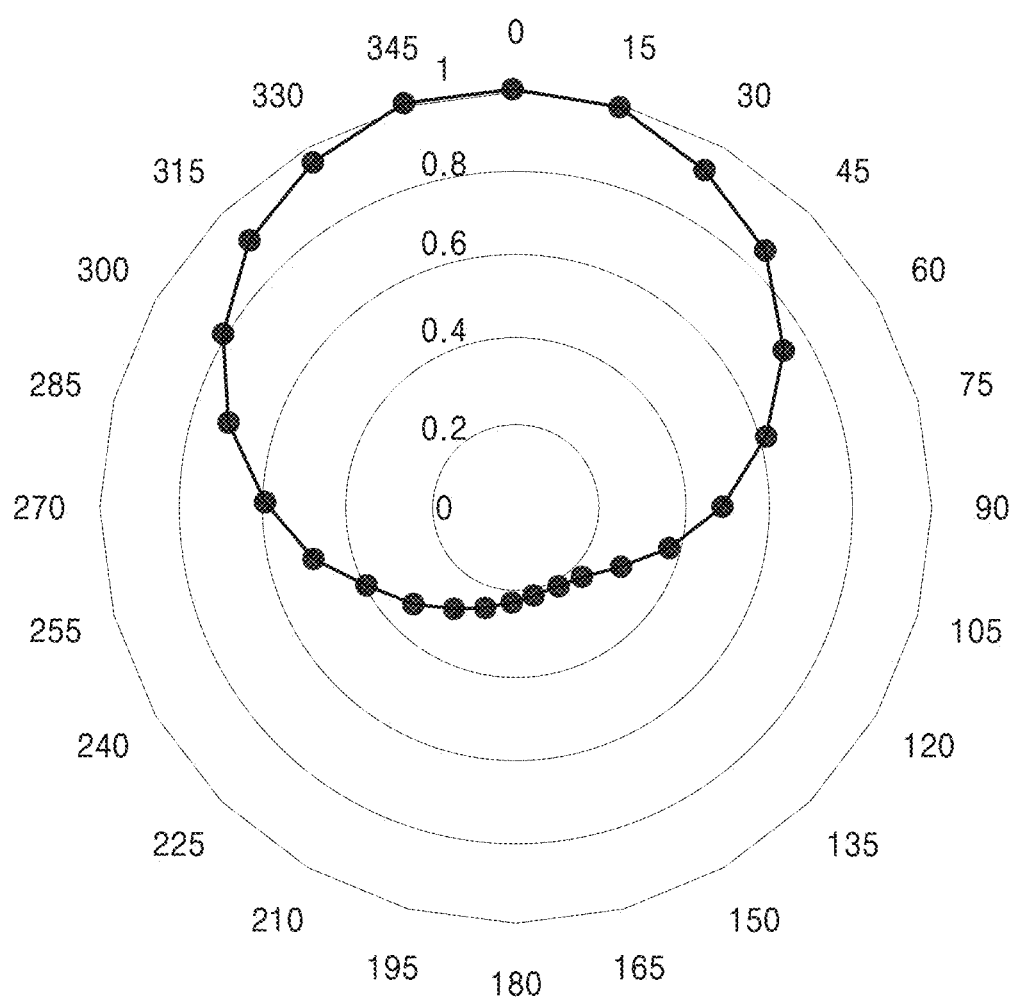
FIG. 10B is a graph showing measurement of a directional pattern of an acoustic signal calculated by summing output signals, according to embodiments.

FIG. 10A is a graph showing measurement of directional patterns of acoustic sensors according to embodiments. FIG. 10B is a graph showing measurement of a directional pattern of an acoustic signal calculated by summing output signals, according to embodiments.

Referring to FIG. 10A, the directional acoustic sensor 10 has a bi-directional pattern, and the non-directional acoustic sensor 42 has an omni-directional pattern. In detail, the directional acoustic sensor 10 may sense a sound transmitted from a region from 315 degrees to 45 degrees corresponding to the front (+z direction of FIG. 5) and a sound transmitted from a region from 135 degrees to 225 degrees corresponding to the rear side (+z direction of FIG. 5). The non-directional acoustic sensor 42 may sense a sound transmitted from all directions of a 360-degree region in the surroundings.

Referring to FIG. 10B, an acoustic signal calculated by summing an output signal of the directional acoustic sensor 10 and an output signal of the non-directional acoustic sensor 42 may have a uni-directional pattern. By using only the directional acoustic sensor 10, only a sound transmitted from the region in the front from 315 degrees to 45 degrees may be sensed, whereas the acoustic sensor assembly 4 (FIG. 4) may sense a sound transmitted from a region from 300 degrees to 60 degrees, which is a broader range than the region from 315 degrees to 45 degrees. As described above, the processor 41 may adjust a directivity of the acoustic sensor assembly 4 by forming a directional pattern that is different from directional patterns of acoustic sensors by a relatively simple calculation using output signals of the non-directional acoustic sensor 42 and the directional acoustic sensor 10.

While a result of a single frequency is illustrated in FIGS. 10A and 10B, as described above with reference to FIGS. 6 and 7, the directional acoustic sensor 10 is uniformly sensitive to various frequencies, and thus, a directional pattern having a same shape may be formed from results with respect to various frequencies. For example, the various frequencies may be in audible frequency ranges, and an acoustic signal may form a directional pattern of a same shape regardless of the level of frequency.

Figure 11A:
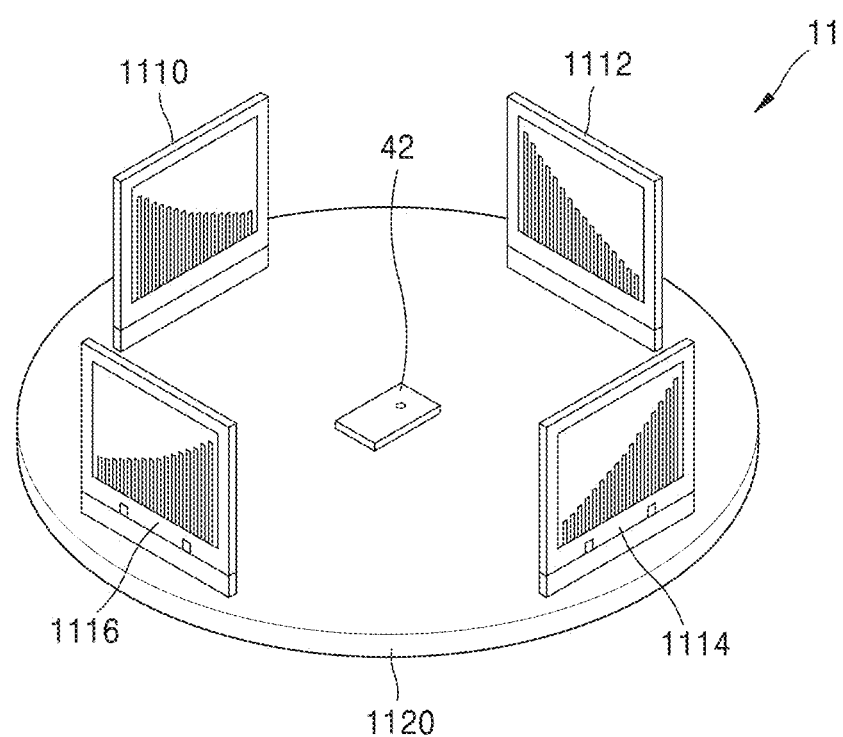
FIG. 11A is a diagram for describing an arrangement of an acoustic sensor assembly including a directional acoustic sensor according to embodiments.
Figure 11B:
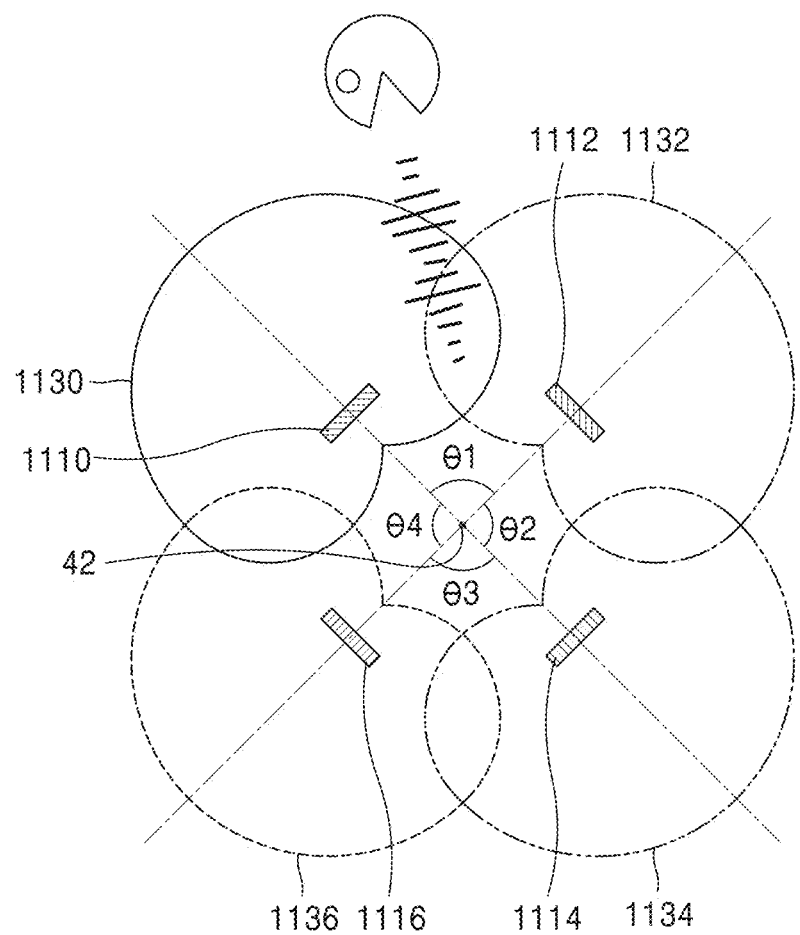
FIG. 11B is a plan view for describing a directional pattern of an acoustic sensor assembly including a directional acoustic sensor according to embodiments.

FIG. 11A is a diagram for describing an arrangement of an acoustic sensor assembly 11 including a directional acoustic sensor according to embodiments. FIG. 11B is a plan view for describing a directional pattern of the acoustic sensor assembly 11 including a directional acoustic sensor according to embodiments.

Referring to FIGS. 11A and 11B, the acoustic sensor assembly 11 may include four (first through fourth) directional acoustic sensors 1110, 1112, 1114, and 1116, the non-directional acoustic sensor 42, and a fixing unit 1120. Each of the plurality of directional acoustic sensors 1110, 1112, 1114, and 1116 may have a same configuration as the directional acoustic sensor 10 described above and illustrated in FIG. 1.

The plurality of directional acoustic sensors 1110, 1112, 1114, and 1116 and the non-directional acoustic sensor 42 may be arranged on the fixing unit 1120, and the plurality of directional acoustic sensors 1110, 1112, 1114, and 1116 may be arranged to have different directivities. The plurality of directional acoustic sensors 1110, 1112, 1114, and 1116 may be arranged to surround the non-directional acoustic sensor 42.

The plurality of directional acoustic sensors 1110, 1112, 1114, and 1116 may be arranged at an angle from each other with respect to the non-directional acoustic sensor 42. The first directional acoustic sensor 1110 and the second directional acoustic sensor 1112 may be arranged at an angle of $\theta 1$ from each other with respect to the non-directional acoustic sensor 42. The second directional acoustic sensor 1112 and the third directional acoustic sensor 1114 may be at an angle of $\theta 2$ from each other, and the third directional acoustic sensor 1114 and the fourth directional acoustic sensor 1116 may be at an angle of $\theta 3$ from each other, and the fourth directional acoustic sensor 1116 and the first directional acoustic sensor 1110 may be at an angle of $\theta 4$ from each other.

For example, the angles of $\theta 1, \theta 2, \theta 3$, and $\theta 4$ may be 90 degrees. However, this is an example, and the angles of $\theta 1, \theta 2, \theta 3$, and $\theta 4$ may be modified.

A distance between each of the plurality of directional acoustic sensors 1110, 1112, 1114, and 1116 and the non-directional acoustic sensor 42 is not limited, and a distance between each of the directional acoustic sensors 1110, 1112, 1114, and 1116 is also not limited. For example, the directional acoustic sensors 1110, 1112, 1114, and 1116 may be arranged equidistantly from the non-directional acoustic sensor 42, or at different distances, or some of them may be equidistantly arranged, and some others may be arranged at different distances from each other.

The plurality of directional acoustic sensors 1110, 1112, 1114, and 1116 may be arranged such that directional patterns of the directional acoustic sensors 1110, 1112, 1114, and 1116 are in a radial direction with respect to the non-directional acoustic sensor 42. As each directional pattern is arranged in a radial direction with respect to the non-directional acoustic sensor 42, sounds transmitted from each direction around the acoustic sensor assembly 11 may be obtained while distinguishing which direction the sounds came from.

As described above with reference to FIG. 5, the directional patterns of the directional acoustic sensor 10 (FIG. 5) and the directional acoustic sensors 1110, 1112, 1114, and 1116 are oriented towards the front (+z direction of FIG. 5) and the rear side (-z direction of FIG. 5) of each of the directional acoustic sensor 10 (FIG. 5) and the directional acoustic sensors 1110, 1112, 1114, and 1116, and thus, a direction in which a directional pattern faces may be a direction that the front or the rear side of the directional acoustic sensors 1110, 1112, 1114, and 1116 faces.

In other words, the plurality of directional acoustic sensors 1110, 1112, 1114, and 1116 may be arranged such that the front or the rear side of each of the directional acoustic sensors 1110, 1112, 1114, and 1116 is in a radial direction with respect to the non-directional acoustic sensor 42.

The processor 41 (FIG. 4) may calculate a plurality of acoustic signals. For example, the processor 41 may calculate a plurality of acoustic signals by using output signals of the non-directional acoustic sensor 42 and the directional acoustic sensors 1110, 1112, 1114, and 1116. The processor 41 may calculate an acoustic signal having a first uni-directional pattern 1130 based on output signals of the first directional acoustic sensor 1110 and the non-directional acoustic sensor 42, and an acoustic signal having a second uni-directional pattern 1132 based on output signals of the second directional acoustic sensor 1112 and the non-directional acoustic sensor 42, and an acoustic signal having a third uni-directional pattern 1134 based on output signals of the third directional acoustic sensor 1114 and the non-directional acoustic sensor 42, and an acoustic signal having a third uni-directional pattern 1136 based on output signals of the fourth directional acoustic sensor 1116 and the non-directional acoustic sensor 42.

The plurality of uni-directional patterns 1130, 1132, 1134, and 1136 may oriented in different directions. For example, each of the plurality of uni-directional patterns 1130, 1132, 1134, and 1136 may be oriented in different directions among the radial directions in which they are oriented with respect to the non-directional acoustic sensor 42. As the plurality of uni-directional patterns 1130, 1132, 1134, and 1136 are formed to cover all directions around the acoustic sensor assembly 11, the acoustic sensor assembly 11 may evenly sense surround sound that allows spatial awareness in all directions around the acoustic sensor assembly 11.

Figure 12A:
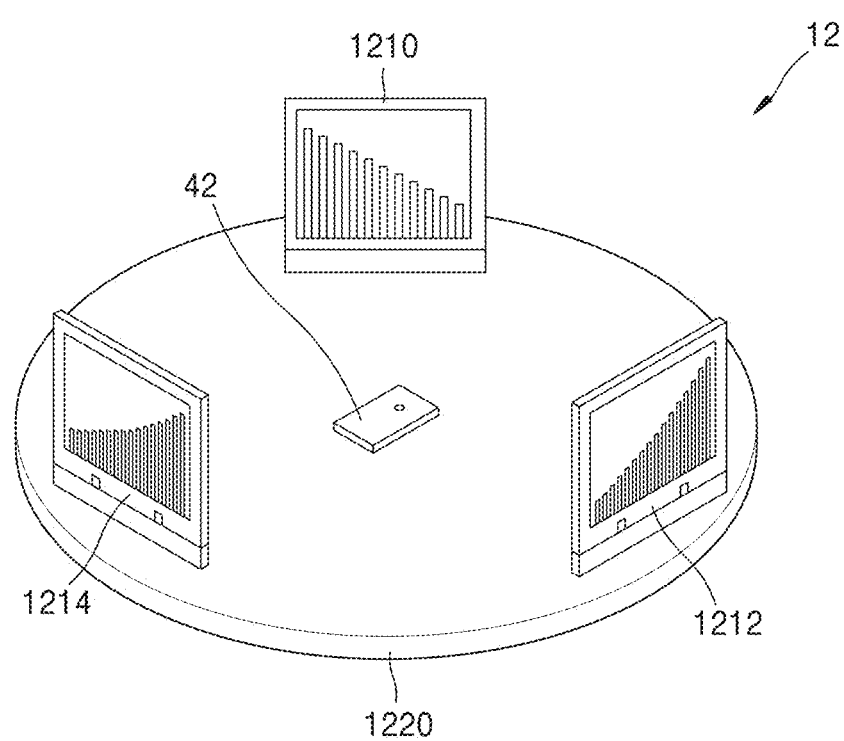
FIG. 12A is a diagram for describing an arrangement of an acoustic sensor assembly including a directional acoustic sensor according to other embodiments.
Figure 12B:
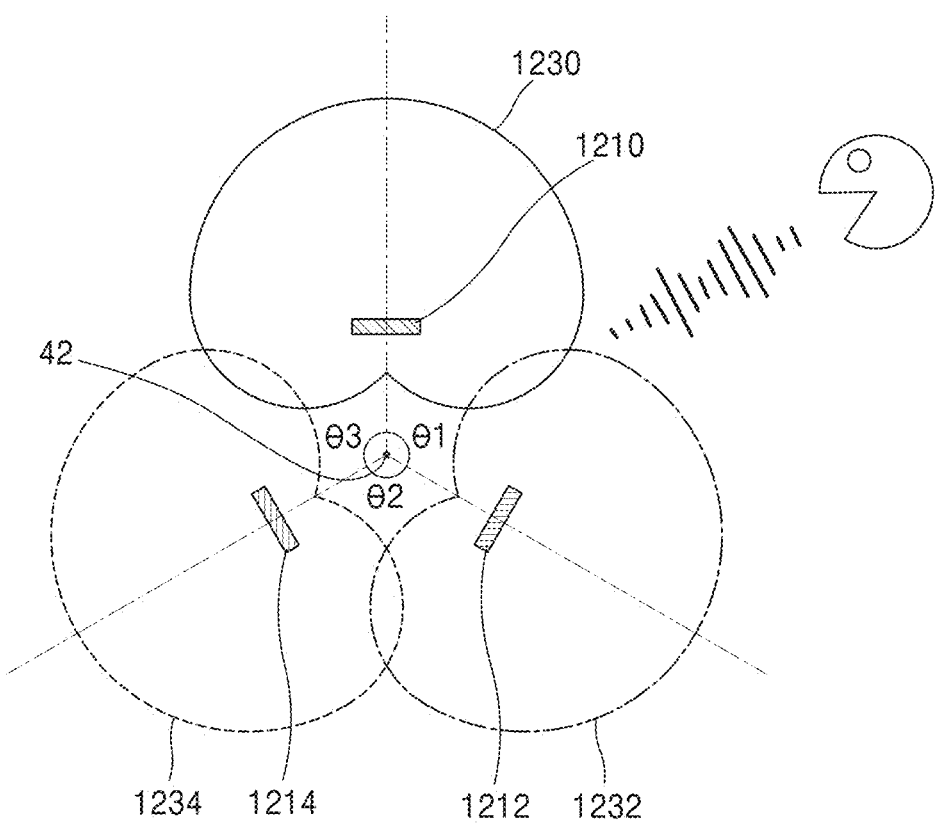
FIG. 12B is a plan view for describing a directional pattern of an acoustic sensor assembly including a directional acoustic sensor according to other embodiments.

FIG. 12A is a diagram for describing an arrangement of an acoustic sensor assembly 12 including a directional acoustic sensor according to other embodiments. FIG. 12B is a plan view for describing a directional pattern of the acoustic sensor assembly 12 including a directional acoustic sensor according to other embodiments.

FIGS. 12A and 12B may include the description provided above with reference to FIGS. 11A and 11B.

Referring to FIGS. 12A and 12B, the acoustic sensor assembly 12 may include three (first through third) directional acoustic sensors 1210, 1212, and 1214, the non-directional acoustic sensor 42, and a fixing unit 1220. Each of the plurality of directional acoustic sensors 1210, 1212, and 1214 may have a same configuration as the directional acoustic sensor 10 illustrated in FIG. 1 described above.

The plurality of directional acoustic sensors 1210, 1212, and 1214 and the non-directional acoustic sensor 42 may be arranged on the fixing unit 1220, and the plurality of directional acoustic sensors 1210, 1212, and 1214 may be arranged to have different directivities.

The plurality of directional acoustic sensors 1210, 1212, and 1214 may be arranged to be at an angle from each other with respect to the non-directional acoustic sensor 42. The first directional acoustic sensor 1210 and the second directional acoustic sensor 1212 may be arranged at an angle of θ1 from each other with respect to the non-directional acoustic sensor 42. The second directional acoustic sensor 1212 and the third directional acoustic sensor 1214 may be at an angle of θ2 with respect to each other, and the third directional acoustic sensor 1214 and the first directional acoustic sensor 1210 may be at an angle of θ3 with respect to each other.

For example, the angles of θ1, θ2, and θ3 may be 120 degrees. However, this is an example, and the angles of θ1, θ2, and θ3 may be modified.

The processor 41 (FIG. 4) may calculate a plurality of acoustic signals. For example, the processor 41 may calculate a plurality of acoustic signals by using output signals of the non-directional acoustic sensor 42 and the \directional acoustic sensors 1210, 1212, and 1214. The processor 41 may calculate an acoustic signal having a first uni-directional pattern 1230 based on output signals of the first directional acoustic sensor 1210 and the non-directional acoustic sensor 42, and an acoustic signal having a second uni-directional pattern 1232 based on output signals of the second directional acoustic sensor 1212 and the non-directional acoustic sensor 42, and an acoustic signal having a third uni-directional pattern 1234 based on output signals of the third directional acoustic sensor 1214 and the non-directional acoustic sensor 42.

The plurality of uni-directional patterns 1230, 1232, and 1234 may be oriented in different directions. For example, each of the plurality of uni-directional patterns 1230, 1232, and 1234 may be oriented in different directions among the radial directions in which they are oriented with respect to the non-directional acoustic sensor 42. As the plurality of uni-directional patterns 1230, 1232, and 1234 are formed to cover all directions around the acoustic sensor assembly 12, the acoustic sensor assembly 12 may evenly sense surround sound that allows spatial awareness in all directions around the acoustic sensor assembly 12.

While calculation of acoustic signals having four and three uni-directional patterns is respectively described with reference to FIGS. 11B and 12B, the number of calculated acoustic signals and a type of directional patterns are not limited to the above description, and various combinations of the number of calculated acoustic signals or a type of the directional patterns may be made by the processor 41.

Figure 13A:
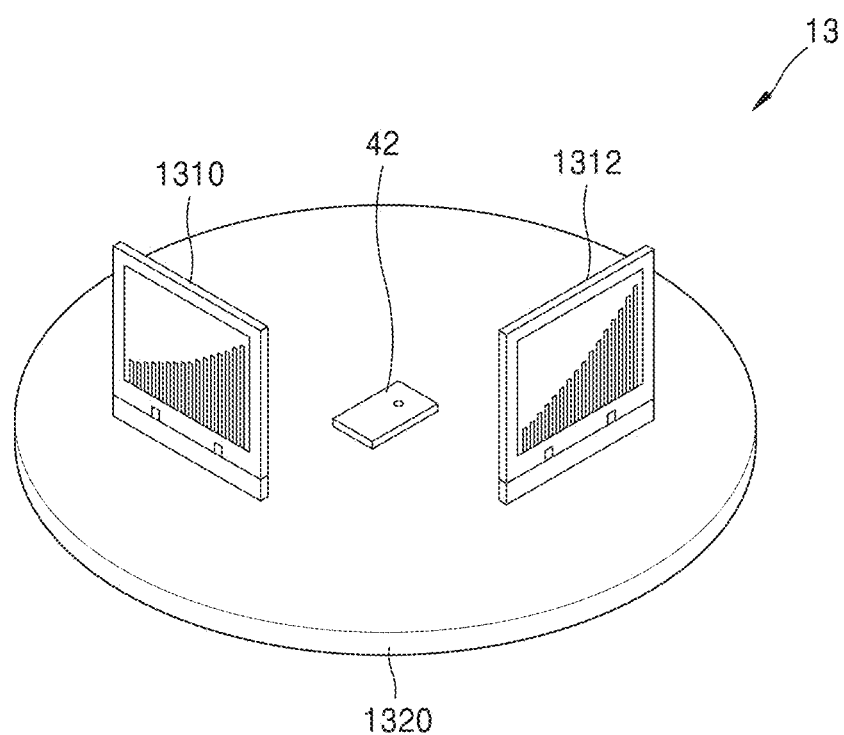
FIG. 13A is a diagram for describing an arrangement of an acoustic sensor assembly including a directional acoustic sensor according to other embodiments.
Figure 13B:
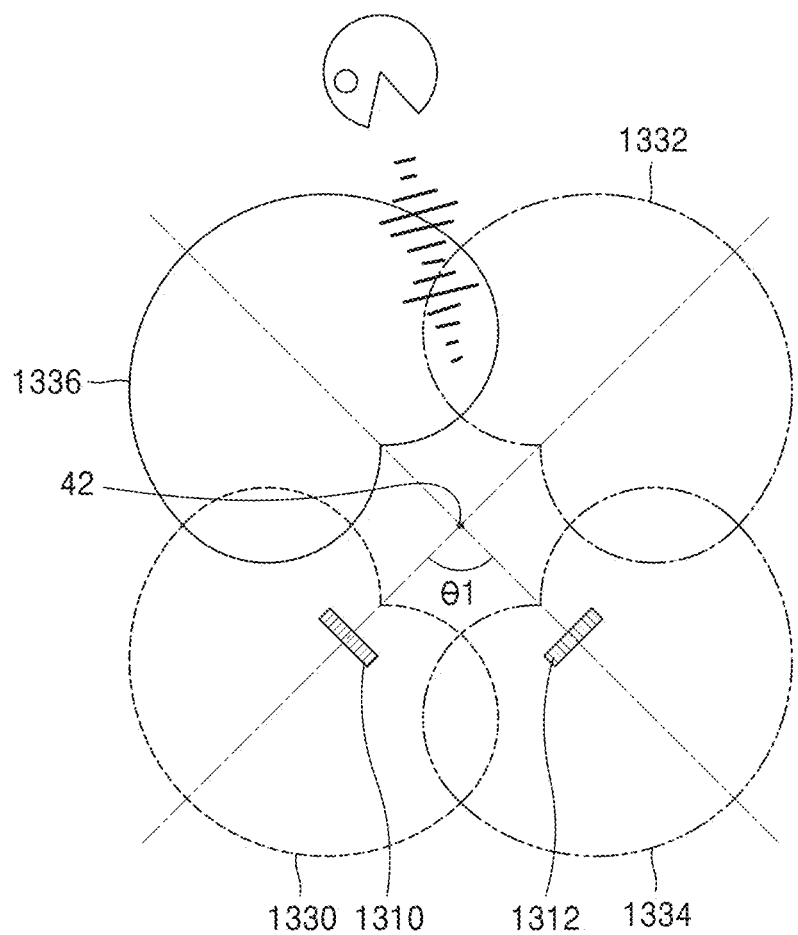
FIG. 13B is a plan view for describing a directional pattern of an acoustic sensor assembly including a directional acoustic sensor according to other embodiments.

FIG. 13A is a diagram for describing an arrangement of an acoustic sensor assembly 13 including a directional acoustic sensor according to other embodiments. FIG. 13B is a plan view for describing a directional pattern of the acoustic sensor assembly 13 including a directional acoustic sensor according to other embodiments.

FIGS. 13A and 13B may include the description provided above with reference to FIGS. 11A through 12B.

Referring to FIGS. 13A and 13B, the acoustic sensor assembly 13 may include two (first and second) directional acoustic sensors 1310 and 1312, the non-directional acoustic sensor 42, and a fixing unit 1320. Each of the plurality of directional acoustic sensors 1310 and 1312 may have a same configuration as the directional acoustic sensor 10 illustrated in FIG. 1 described above.

The plurality of directional acoustic sensors 1310 and 1312 and the non-directional acoustic sensor 42 may be arranged on the fixing unit 1320, and the plurality of directional acoustic sensors 1310 and 1312 may be arranged to have different directivities.

The plurality of directional acoustic sensors 1310 and 1312 may be arranged to be at an angle from each other with respect to the non-directional acoustic sensor 42. The first directional acoustic sensor 1310 and the second directional acoustic sensor 1312 may be arranged at an angle of θ1 from each other with respect to the non-directional acoustic sensor 42. For example, the angle of θ1 may be 90 degrees. However, this is an example, and the angle of θ1 may be modified.

The processor 41 (FIG. 4) may calculate a plurality of acoustic signals. The plurality of acoustic signals may include an acoustic signal having a directional pattern oriented toward the rear side direction (e.g., −z direction of FIG. 5) of the directional acoustic sensor 10 described above with reference to FIG. 8A. For example, the processor 41 may calculate an acoustic signal having a first uni-directional pattern 1330 oriented toward a front direction of the first directional acoustic sensor 1310 and an acoustic signal having a second uni-directional pattern 1332 oriented toward a rear surface of the first directional acoustic sensor 1310 based on output signals of the first directional acoustic sensor 1310 and the omni-directional acoustic sensor 42. The processor 41 may calculate an acoustic signal having a third uni-directional pattern 1334 oriented toward a front direction of the first directional acoustic sensor 1334 and an acoustic signal having a fourth uni-directional pattern 1336 oriented toward a rear side direction of the second directional acoustic sensor 1312 based on output signals of the second directional acoustic sensor 1312 and the omni-directional acoustic sensor 42.

Unlike the acoustic sensor assembly 11 of FIG. 11A, the acoustic sensor assembly 13 of FIG. 13A may calculate acoustic signals having the uni-directional patterns 1330, 1332, 1334 and 1336 having different directivities, by using the two directional acoustic sensors 1310 and 1312. As the uni-directional patterns 1330, 1332, 1334 and 1336 are configured to obtain sounds transmitted from all directions of the surroundings by distinguishing from which direction the sounds came, the acoustic sensor assembly 13 may evenly sense surround sound that allows spatial awareness in all directions around the acoustic sensor assembly 13. As the two directional acoustic sensors 1310 and 1312 are used, a size of the acoustic sensor assembly 13 may be further reduced, and the complexity of circuitry structure for connecting elements of the acoustic sensor assembly 13 may be reduced.

Figure 14:
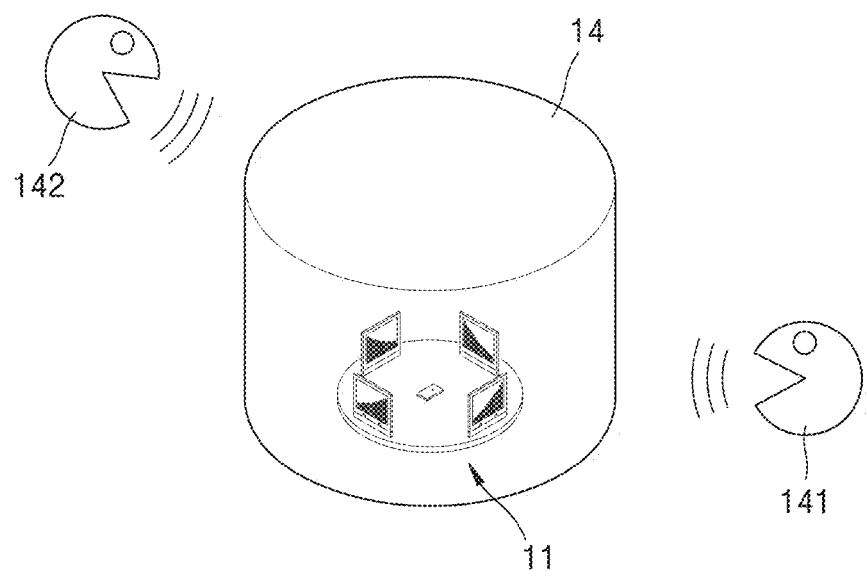
FIG. 14 is a diagram illustrating an acoustic sensor assembly according to embodiments, mounted in an electronic device.

FIG. 14 is a diagram illustrating the acoustic sensor assembly 11 according to embodiments, mounted in an electronic device 14.

Referring to FIG. 14, the acoustic sensor assembly 11 may be mounted in the electronic device 14 that may need to acquire ambient sound. For example, the electronic device 14 may be a sensor device, a smart speaker, a mobile phone, a vehicle assistance device, a TV, an Internet of Things (IoT) smart device, a mobile device, an augmented reality (AR) device, or a virtual reality (VR) device. Hereinafter, the acoustic sensor assembly 11 of FIG. 11A is mounted (in the electronic device 14) for description, but the disclosure is not limited thereto, and any acoustic sensor assembly (the acoustic sensor assembly 4 of FIG. 4, the acoustic sensor assembly 12 of FIG. 12A, or the acoustic sensor assembly 13 of FIG. 13A) may also be mounted in the electronic device 14.

By including the acoustic sensor assembly 11, the electronic device 14 may obtain sound by using a directional pattern in a direction, detect a direction of transmitted sound, or obtain sound around the electronic device 14 in such a way that allows spatial awareness based on various combinations of directional patterns.

For example, when a first user 141 and a second user 142 have a conversation around the electronic device 14, the electronic device 14 may detect each direction in which each user is located or sense only the voice of the first user 141 by using a directional pattern oriented toward the first user 141, or sense only the voice of the second user 142 by using a directional pattern oriented toward the second user 142, or simultaneously sense the voices of both the first and second users 141 and 142 while distinguishing which directions the voices come from.

The acoustic sensor assembly 11 mounted in the electronic device 14 has a uniform sensitivity to various frequencies of sounds sensed, and is easy to be reduced in size because there is no restriction on the distances between each acoustic sensor. Also, the degree of freedom of operation of the acoustic sensor assembly 11 is high as various directional patterns may be selected or used in combination according to a location of the acoustic sensor assembly 11 or conditions around the acoustic sensor assembly 11. In addition, only relatively simple calculations such as summation or subtraction are used to control the acoustic sensor assembly 11, and accordingly, calculation resources may be used efficiently.

FIG. 15 is a flowchart of a method of sensing sound, according to embodiments.

Referring to FIG. 15, the method of sensing sound includes operations processed in time series in the acoustic sensor assemblies described above (the acoustic sensor assembly 4 of FIG. 4, the acoustic sensor assembly 11 of FIG. 11A, the acoustic sensor assembly 12 of FIG. 12A, or the acoustic sensor assembly 13 of FIG. 13A) described above. Thus, details that may be omitted below but provided above in relation to the acoustic sensor assemblies of the drawings described above (the acoustic sensor assembly 4 of FIG. 4, the acoustic sensor assembly 11 of FIG. 11A, the acoustic sensor assembly 12 of FIG. 12A, or the acoustic sensor assembly 13 of FIG. 13A) may apply to the method of FIG. 15.

In operation 151, the processor (the processor 41 of FIG. 4) may obtain output signals from the non-directional acoustic sensor 42 having a first directional pattern and the plurality of directional acoustic sensors 43a, 43b, ..., 43n that are arranged to surround the non-directional acoustic sensor 42, include a plurality of resonators having different resonance frequencies from each other, and respectively have a second directional pattern.

The processor (41 in FIG. 4) may obtain output signals from the plurality of directional acoustic sensors 43a, 43b, ..., 43n arranged such that the second directional pattern of each of the directional acoustic sensors 43a, 43b, ..., 43n is in a radial direction with respect to the non-directional acoustic sensor 42.

The processor 41 may obtain an output signal that is output by the plurality of directional acoustic sensors 43a, 43b, ..., 43n by sensing, in a direction, a sound that is in-phase with a phase of a sound sensed by a non-directional acoustic sensor, and an output signal that is output by sensing, in an opposite direction to the above direction, a sound that is in anti-phase with the phase of the sound sensed by the non-directional acoustic sensor.

In operation 152, the processor (41 of FIG. 4) may calculate an acoustic signal having a directivity by selecting at least one of the output signals or selectively combining the output signals.

The processor 41 may calculate a plurality of acoustic signals having third directional patterns oriented in different directions.

The processor 41 may calculate an acoustic signal by calculating any one or any combination of a sum of and a difference between ratios of a first output signal of the non-directional acoustic sensor 42 and second output signals of the plurality of directional acoustic sensors 43a, 43b, ..., 43n.

The processor 41 may calculate an acoustic signal having a third directional pattern facing the front direction of the directional acoustic sensors 43a, 43b, ..., 43n corresponding to the second output signal, by calculating a sum of ratios of the first output signal and the second output signals.

The processor 41 may calculate an acoustic signal having the third directional pattern facing the rear side direction of the directional acoustic sensors 43a, 43b, ..., 43n corresponding to the second output signal, by calculating a difference between ratios of the first output signal and the second output signals.

In operation 153, the processor (41 of FIG. 4) may obtain surround sound by using the acoustic signal.

The processor 41 may acquire surround sound by using a plurality of acoustic signals.

The embodiments described above can be written as computer programs that can be implemented in general-use digital computers that execute the programs using a computer readable recording medium. Also, data structures used in the embodiments described above may be written to the computer readable recording medium using various means. Examples of the computer readable recording medium include magnetic storage media (e.g., ROM, floppy disks, hard disks, etc.) and optical recording media (e.g., CD-ROMs, or DVDs).

It may be understood that embodiments described herein may be considered in a descriptive sense only and not for purposes of limitation. Descriptions of features or aspects within each embodiment may be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An acoustic sensor assembly comprising:
a non-directional acoustic sensor having a first directional pattern;
a plurality of directional acoustic sensors surrounding the non-directional acoustic sensor and comprising a plurality of resonators having different resonance frequencies from each other, each of the plurality of directional acoustic sensors having a second directional pattern; and
a processor configured to:
obtain output signals from the non-directional acoustic sensor and the plurality of directional acoustic sensors;

calculate an acoustic signal having directivity by combining each of the obtained output signals based on ratios of a signal level output by the non-directional acoustic sensor and signal levels output by each of the plurality of directional acoustic sensors; and obtain sound surrounding the acoustic sensor assembly in multiple directions, using the calculated acoustic signal.

2. The acoustic sensor assembly of claim 1, wherein the processor is further configured to calculate additional directional patterns different from the first directional pattern and the second directional pattern, wherein the number of directional acoustic sensors is 2 and the additional patterns comprise four directional patterns to obtain sound surrounding 360 degrees around the acoustic sensor assembly.

3. The acoustic sensor assembly of claim 1, wherein each of the plurality of directional acoustic sensors is configured to:

sense, in a direction of the second directional pattern, a sound that is in-phase with a phase of a sound that is sensed by the non-directional acoustic sensor; and sense, in a direction opposite to the direction of the second directional pattern, a sound that is anti-phase with the phase of the sound sensed by the non-directional acoustic sensor.

4. The acoustic sensor assembly of claim 1, wherein the processor is further configured to calculate the acoustic signal having a third directional pattern different from the first directional pattern and the second directional pattern.

5. The acoustic sensor assembly of claim 4, wherein the first directional pattern is omnidirectional, the second directional pattern is bi-directional, and the third directional pattern is uni-directional.

6. The acoustic sensor assembly of claim 1, wherein processor is further configured to:

calculate a plurality of acoustic signals having third directional patterns oriented in different directions from each other; and obtain the sound around the acoustic sensor assembly, using the calculated plurality of acoustic signals.

7. The acoustic sensor assembly of claim 1, wherein the processor is further configured to calculate the acoustic signal by calculating a sum of or a difference of the signal output by the non-directional acoustic sensor and the signal outputs by each of the plurality of directional acoustic sensors.

8. The acoustic sensor assembly of claim 7, wherein the processor is further configured to calculate the acoustic signal having a third directional pattern in a front direction of one of the plurality of directional acoustic sensors corresponding to second output signal levels, by calculating the sum of the ratios of a first output signal level and the second output signal levels.

9. The acoustic sensor assembly of claim 7, wherein the processor is further configured to calculate the acoustic signal having a third directional pattern in a rear side direction of one of the plurality of directional acoustic sensor corresponding to second output signal levels, by calculating the difference between the ratios of the first output signal level and the second output signal levels.

10. The acoustic sensor assembly of claim 1, wherein each of the plurality of directional acoustic sensors further comprises a support, and the plurality of resonators extend from the support in a length direction.

11. The acoustic sensor assembly of claim 10, wherein each of the plurality of resonators comprises:

a driver moving based on input sound; and a sensor detecting movement of the driver.

12. An acoustic sensor assembly of claim wherein the acoustic sensor assembly is implemented in an electronic device.

13. A method of sensing sound, the method comprising:

obtaining output signals from a non-directional acoustic sensor having a first directional pattern and a plurality of directional acoustic sensors, the plurality of directional acoustic sensors surrounding the non-directional acoustic sensor, and comprising a plurality of resonators having different resonance frequencies from each other, and each of the plurality of directional acoustic sensors having a second directional pattern;

using a processor to calculate an acoustic signal having directivity by combining each the obtained output signals based on ratios of a signal level output by the non-directional acoustic sensor and signal levels output by each of the plurality of directional acoustic sensors; and obtaining sound surrounding an acoustic sensor assembly in multiple directions, using the acoustic calculated signal.

14. The method of claim 13, wherein the processor is further configured to calculate additional directional patterns different from the first directional pattern and the second directional pattern, wherein the number of directional acoustic sensors is 2 and the additional patterns comprise four directional patterns to obtain sound surrounding 360 degrees around the acoustic sensor assembly.

15. The method of claim 13, wherein the obtaining of the output signals comprises:

sensing, in a direction of the second directional pattern, a sound that is in-phase with a phase of a sound that is sensed by the non-directional acoustic sensor; and sensing, in a direction opposite to the direction of the second directional pattern, a sound that is anti-phase with the phase of the sound sensed by the non-directional acoustic sensor.

16. The method of claim 13, wherein the calculating of the acoustic signal comprises calculating a plurality of acoustic signals having third directional patterns oriented in different directions from each other, and the obtaining of the sound comprises obtaining the sound, using the calculated acoustic signals.

17. The method of claim 13, wherein the calculating of the acoustic signal comprises calculating the acoustic signal by calculating a sum of or a difference of the signal output by the non-directional acoustic sensor and the signals output by each of the plurality of directional acoustic sensors.

18. The method of claim 17, wherein the calculating of the acoustic signal further comprises calculating the acoustic signal having a third directional pattern in a front direction of one of the plurality of directional acoustic sensors corresponding to second output signal levels, by calculating the sum of the ratios of the first output signal level and the second output signal levels.

19. The method of claim 17, wherein the calculating of the acoustic signal further comprises calculating the acoustic signal having a third directional pattern in a rear side direction of one of the plurality of directional acoustic sensors corresponding to second output signal levels, by calculating the difference between the ratios of the first output signal level and the second output signal levels.

20. A non-transitory computer-readable storage medium storing instructions that, when executed by at least one processor, cause the at least one processor to perform the method of claim 13.

\* \* \* \* \*